United States Patent [19]
Shih et al.

[11] Patent Number: 5,810,607
[45] Date of Patent: *Sep. 22, 1998

[54] INTERCONNECTOR WITH CONTACT PADS HAVING ENHANCED DURABILITY

[75] Inventors: Da-Yuan Shih, Poughkeepsie; Paul Lauro, Nanuet; Keith Edward Fogel, Mohegan Lake; Brian Beaman, Hude Park; Maurice Norcott, Fishkill, all of N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 527,733
[22] Filed: Sep. 13, 1995
[51] Int. Cl.$^6$ ........................................................ H01R 9/09
[52] U.S. Cl. .................................. 439/66; 439/91; 439/71
[58] Field of Search ................................. 439/66, 71, 91, 439/591

[56] References Cited

U.S. PATENT DOCUMENTS

| | | | |
|---|---|---|---|
| 2,961,746 | 11/1960 | Lyman | 29/848 |
| 3,430,338 | 3/1969 | Flaherty | 29/848 |
| 3,541,222 | 11/1970 | Parks et al. . | |
| 3,557,446 | 1/1971 | Charschan | 29/853 |
| 3,795,037 | 3/1974 | Luttmer . | |
| 3,862,790 | 1/1975 | Davies et al. . | |
| 3,889,363 | 6/1975 | Davies | 29/848 |
| 3,954,317 | 5/1976 | Gilissen et al. . | |
| 4,003,621 | 1/1977 | Lamp . | |
| 4,008,300 | 2/1977 | Ponn . | |
| 4,295,700 | 10/1981 | Sado . | |
| 4,329,780 | 5/1982 | Somers | 29/848 |
| 4,355,199 | 10/1982 | Luc . | |
| 4,402,562 | 9/1983 | Sado . | |
| 4,408,814 | 10/1983 | Takashi et al. . | |
| 4,509,099 | 4/1985 | Takamatsu et al. . | |
| 4,520,562 | 6/1985 | Sado et al. . | |
| 4,548,451 | 10/1985 | Benarr et al. . | |
| 4,555,523 | 11/1985 | Hall et al. . | |
| 4,575,166 | 3/1986 | Kasdagly et al. . | |
| 4,577,918 | 3/1986 | Kasdagly . | |
| 4,778,950 | 10/1988 | Lee et al. . | |
| 4,793,814 | 12/1988 | Zifcak et al. . | |
| 4,820,170 | 4/1989 | Redmond et al. . | |

(List continued on next page.)

OTHER PUBLICATIONS

"Shaped Elastomeric Interposer for Large Area Array Connectors", Disclosed Anonymously, Research Disclosure, Apr. 1991, No. 324, K. Mason Publications, Ltd., England.
"Elastomeric Interposer Using Wires in Elastomer Pad with Controlled Compliance" Disclosed Anonmounsly, Research Disclosure, Apr. 1991, No. 324,K. Mason Pub.Ltd.Eng.
"Elastomeric Interposer Using Film–Supported Metal Conductors" Disclosed Anonymously—Research Disclosure, Apr. 1991, No. 324, K. Mason Publications, Ltd., England.
"High Density Area Array Connector" Disclosed Anonymously, Research Disclosure, Apr. 1991, No. 324, K. Mason Publications Ltd., England.

*Primary Examiner*—Gary F. Paumen
*Attorney, Agent, or Firm*—Daniel P. Morris

[57] ABSTRACT

A structure of an enhanced durability interconnector to reliably interconnect modules having high density type contacts, such as found in modules having solder ball connections (SBC), to a connecting article such as a printed circuit board. The structure comprising a means to provide the SBC type contact a mating surface having a wide contact area. Furthermore, the electrical connecting medium within the interconnector, which is embedded in an elastomeric material to provide compliance, is strengthened by using two or more embedded wires in combination for each wide contact area contact. The interconnector is incorporated into a fixture to compress the interconnector between the SBC module and the connecting article. The fixture having further capability to align the connections, control the compression pressure and to prevent over-compression.

18 Claims, 9 Drawing Sheets

U.S. PATENT DOCUMENTS

| | | |
|---|---|---|
| 4,820,376 | 4/1989 | Lambert et al. . |
| 4,832,609 | 5/1989 | Chung . |
| 4,991,290 | 2/1991 | MacKay . |
| 4,998,885 | 3/1991 | Beaman . |
| 5,037,312 | 8/1991 | Casciotti et al. . |
| 5,049,084 | 9/1991 | Bakke . |
| 5,099,309 | 3/1992 | Kryzaniwsky . |
| 5,371,654 | 12/1994 | Beaman et al. . |
| 5,413,489 | 5/1995 | Switky ................................. 439/71 |
| 5,518,410 | 5/1996 | Masami ................................. 439/71 |
| 5,611,696 | 3/1997 | Donner et al. ........................ 439/66 |

INTERCONNECTOR WITH CONTACT PADS HAVING ENHANCED DURABILITY

FIELD OF THE INVENTION

The present invention is directed to an electrical interconnector, in particular the connection of an electrical module to a circuit board, and more particularly to the provision of socket type inter-connection means for modules having contacts suitable for high density applications.

BACKGROUND OF THE INVENTION

It is a constant endeavor to find ways of increasing the pinout density of integrated circuits (ICs). This is particularly important in ICs with high pin counts and relatively small packages. Solder ball connection (SBC) technology was developed to satisfy this growing need. In general the number of electronic circuits that can be manufactured per unit area of silicon or board space has increased dramatically in recent years. This increase in circuit density has produced a corresponding increase in the number of connections required between the various electronic circuits, integrated circuit modules, and boards to facilitate the manufacture of more complex products. High density integrated circuit modules such as microprocessors are typically housed in a protective package such as a pin grid array (PGA) module, that provides a means of connecting to other electronic circuits on a printed circuit board. PGA modules have an array of metal pins on the bottom side of the package. The PGA module is often connected and disconnected through these pins to a test card to evaluate the individual electronic circuit components before they are assembled into a final product. Connector sockets are available for PGA modules to facilitate the connection and disconnection of the PGA module for service, upgrade, or testing requirements.

Solder ball connection (SBC) modules have recently been developed to address the need for more signal and ground connections, higher density packaging, and compatibility with surface mount technology processes. SBC modules are different than PGA modules in that the SBC module uses solder balls instead of metal pins to provide for interconnections between the module and the printed circuit board. Whereas PGA pins are spaced 0.10 inches apart, the solder balls are typically arranged in an area array pattern with 0.05 inch spacing. This close spacing makes it difficult to use previous interconnector technologies for SBC sockets. Thus, although SBC modules have service, upgrade, burn-in and testing requirements similar to PGA modules, SBC interconnecting sockets are not commonly available.

Because of the SBC pin densities, a specialized technology such as that generally used in elastomeric connectors is one of the various interconnection technologies that can be used for an SBC socket. The elastomeric connector provides a conductive path through an elastomeric material to connect the solder balls on the SBC module to the contact pads on the printed circuit board. A wide variety of elastomeric connectors are available that use conductive particles or conductive wires embedded in the elastomer material. The electrical, mechanical, and thermal performance of the elastomeric connector can vary significantly depending on the size, shape, orientation, and density of the conductive particles as well as the properties of the elastomer material. An SBC socket has unique requirement which need to be satisfied if the socket is to be useful, reliable and durable. Elastomeric connectors that are suitable for area array interconnections have previously been described.

U.S. Pat. No. 4,998,885, issued Mar. 12, 1991 to Beaman et al., is directed to an elastometer area array interposer. It provides for an elastomeric interposer surrounding fine metal wires which extend through the elastomeric materials permanently bonded to a rigid wiring substrate. It is useful for electrically connecting two substrates having high density interconnections. The structure described is comprised of conductive wires embedded in an elastomer material that are permanently bonded to the rigid wiring substrate. The contact interface is comprised of ball shaped gold wire conductors surrounded by an elastomer material. It is specifically adapted to interconnecting with flat gold plated pads on the surface of the mating substrate. The ball shaped contact surface is not large enough for use with an SBC type contact. SBC interconnection with this type of a ball shaped contact surface would cause excessive degradation of the connecting wires and ball shaped contact and limit the durability and reliability of the interface for socket applications.

U.S. Pat. No. 5,371,654, issued Dec. 6, 1994 to Beaman et al., is directed to a structure for packaging electronic devices, such as semiconductor chips, in a three dimensional structure. The structure includes a multilayer wiring substrate for X-Y connections along with an elastomeric connector for Z axis connections. The elastomeric connector described is specifically adapted to a three dimensional packaging approach and does not require a contact interface with high durability. Also, the contact interface in this patent is comprised of an elastomeric connector having gold wire conductors mated to flat gold plated pads on the surface of the multilayer wiring substrate. The contact interface on the elastomeric connector would not be compatible for connection to the solder ball on an SBC module.

The present invention provides solutions to the unique SBC module interconnecting problems. The following interconnector requirements should be considered in order to satisfactorily connect to a module whose pinouts are solder ball connections.

Firstly, the solder ball connections have irregular ball sizes. Additionally, the printed circuit board to which the module is connected has planarity variations of its contact pads. Thus, the interconnector contact interface should have high compliance to enable it to yield elastically when contact forces are applied.

Secondly, the SBC interconnector should have a contact metallurgy such that it does not form a high resistance intermetallic layer with the solder balls even for high temperature applications.

Thirdly, the interconnector should be such as to minimize deformation of the solder ball while the SBC module is connected to the interconnecting structure.

Fourthly, the SBC interconnector contact interface should be of high durability to allow multiple repeated connections and disconnections of the SBC module without degradation.

In addition, the SBC interconnector should act as a clamping fixture so as to provide consistent pressure between the SBC module and the interconnector contacts. Preferably, the fixture should include a means of aligning the corresponding contacts on the interconnector with the solder balls on the module and also with the connecting article.

SUMMARY OF THE INVENTION

It is an object of the present invention to provide an improved electrical connecting device. Another object of the present invention is to provide a means for the connecting device to act as a clamping fixture so as to provide consistent pressure between the contacts of a module being interconnected, the interconnecting device and a connecting article. Preferably, the fixture should include a means of aligning the corresponding contacts on the interconnecting device with the module contacts and also with the connecting article.

A broad aspect of the present invention is a structure having a dielectric body. The dielectric body has a first surface, a second surface, and at least one embedded conductive member. Each conductive member has a first end extending to or through the first body surface, and a second end extending to or through the second surface. At least one of the ends being enlarged and having a wide top surface area.

In a particular aspect of the present invention, an enlarged end is comprised of a grouping means for grouping together a combination of at least two embedded members.

In another particular aspect of the present invention, the structure further comprises a compression means: for compressing a solder ball connection on an external component to an enlarged end of the structure; for compressing an enlarged end of an embedded wire to a solder ball connection on an external component; and to compress the other end of the embedded wire to a contact on an external article.

In still another particular aspect of the present invention, the structure further comprises a component having at least one solder ball connection making contact with an enlarged end of an embedded wire or wire grouping, and a connecting article having at least one article contact making connection with the other end of the embedded wire or a wire grouping of embedded wires. The structure also has a compression means for compressing the solder ball connection to the enlarged end and preferably to also compress the article contact to the other wire end or wire grouping.

In another particular aspect of the present invention, the structure's compression means further comprises: one or more spacers disposed such as to prevent over compression; one or more contact alignment means to align the structure with a connecting article and/or a connecting component; and/or a stiffener disposed so as to prevent bowing of the external article.

Another broad aspect of the present invention is a process to make a structure comprising the steps of: providing an electrically conductive substrate having a periphery, a first substrate surface and a second substrate surface; attaching a first plurality of conductive pads to the first substrate surface; attaching a second plurality of conductive pads to the second substrate surface disposed to correspond with and be opposite to the first plurality of conductive pads and leaving an exposed substrate area on the substrate; attaching at least one conductive member to each of the first plurality of conductive pads, with the conductive member disposed such as to form a free standing structure having a straight end; forming at each straight end an enlarged wire bonding contact having a wide top area surface; placing a dam upon the first surface such as to enclose its periphery, with the dam being disposed such as to surround the conductive members; filling the dam with a dielectric material such as to leave each wire bonding contact exposed at a top face of the dielectric material; and etching away the substrate at its exposed substrate area such as to leave an array of individual button contacts.

In a more particular aspect of the process according to the present invention, the enlarged contact is formed by bonding a conductive contact pad to one or more of the wire bonding contacts at the enlarged contact surface, or the enlarged contact is formed by bonding a polymer pad to one or more of the wire bonding contacts at the enlarged contact surface.

DETAILED DESCRIPTION

The present invention provides an improved electrical connecting device useable for interconnecting a module having high density type contacts with a printed circuit board or with another module. In particular, this invention is a structure, to be referred henceforth as an interconnector, for the interconnection of a connecting article with a module having contacts preferably of the SBC type. The significance of the SBC interconnector contact area problem is observed by considering the illustration of FIG. 1.

Figure 1:
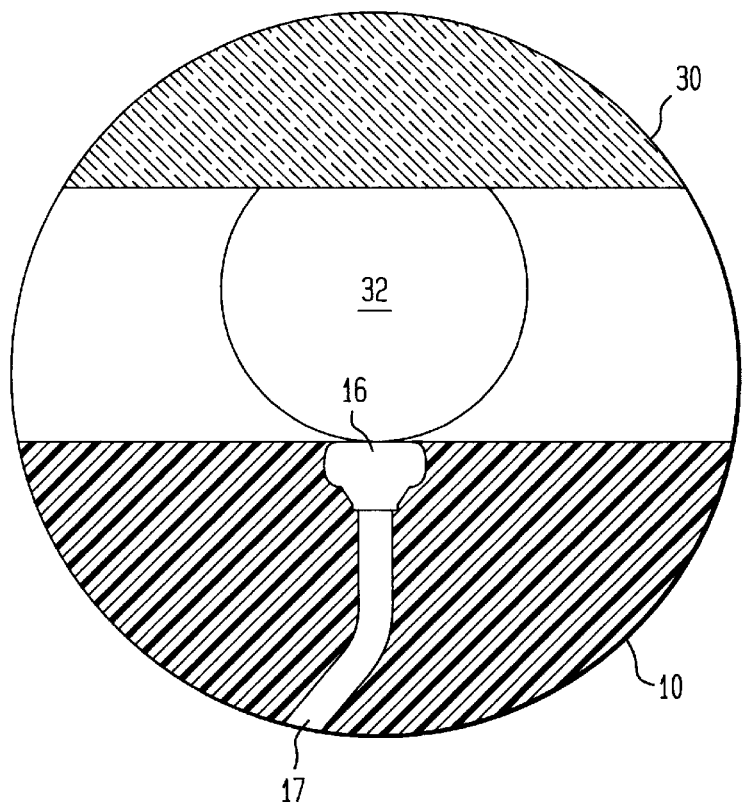
FIG. 1 shows a magnified view of a solder ball contact in typical relationship to an unmodified wire bonding contact.

FIG. 1 shows a magnified view of an SBC module 30 mated with an interconnector 10. The solder ball contact 32 is shown in typical relationship to a heretofore typical elastomeric socket wire bonding contact 16 formed at an end of an embedded wire 17. The wire bonding contact 16 is 1 to 10 mils in diameter. Thus, the irregular 20 to 40 mil diameter solder ball 32 cannot make reliable or durable contact with the wire bonding contact 16. It has been found that when the wire bonding contact 16 is not modified or supported, repeated engagements and disengagements with the solder ball contact 32 causes degradation of the wire contact end and its embedded wire. The inventors have shown experimentally that enlarging and/or supporting the top surface area of the wire bonding contact 16 increases the durability and reliability of the interconnector 10.

Figure 2:
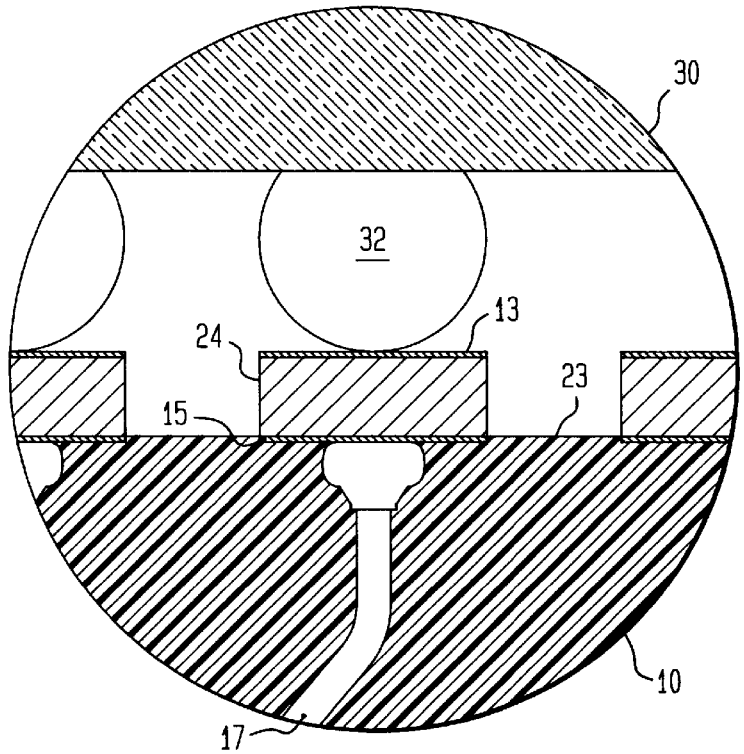
FIG. 2 shows a magnified view of a solder ball contact in relationship to a conductive pad contact attached to a single embedded wire.

Experiments have shown that a means to achieve repeated, long term and reliable connectivity is to enlarge the top surface area of the wire bonding contact. Several alternative means are herein described which provide the needed enlarged top surface area. In one means shown in FIG. 2, a conductive contact pad 24 having a wide top-surface-area 13 is attached to each wire bonding contact 16 on the interconnector top surface 23 of interconnector 10. The contact pad 24 is attached to the wire bonding contact 16 along the pad's bottom surface 15. The pad's bottom surface is generally plated with a noble metal to enable formation of a low resistance attachment. The contact pad's 24 top surface area 13 makes available to the solder ball a wide area of contact surface area. The top surface area 13 is also generally plated. Compression of the solder ball contact 32 of an SBC module 30 against a contact pad 24 results in a reliable and durable electrical connection.

It has also been found that difficulty in providing durable connection and consistent pressure between the SBC module 30 and the interconnector contacts is largely due to the small size and weakness of each individual embedded wire 17 which is used as the interconnecting medium. The medium is inadequate to withstand the long-term and repeated applied pressure from a module's solder ball contact 32. A means is desirable for strengthening the interconnecting medium used to make connection with each solder ball contact.

Figure 3:
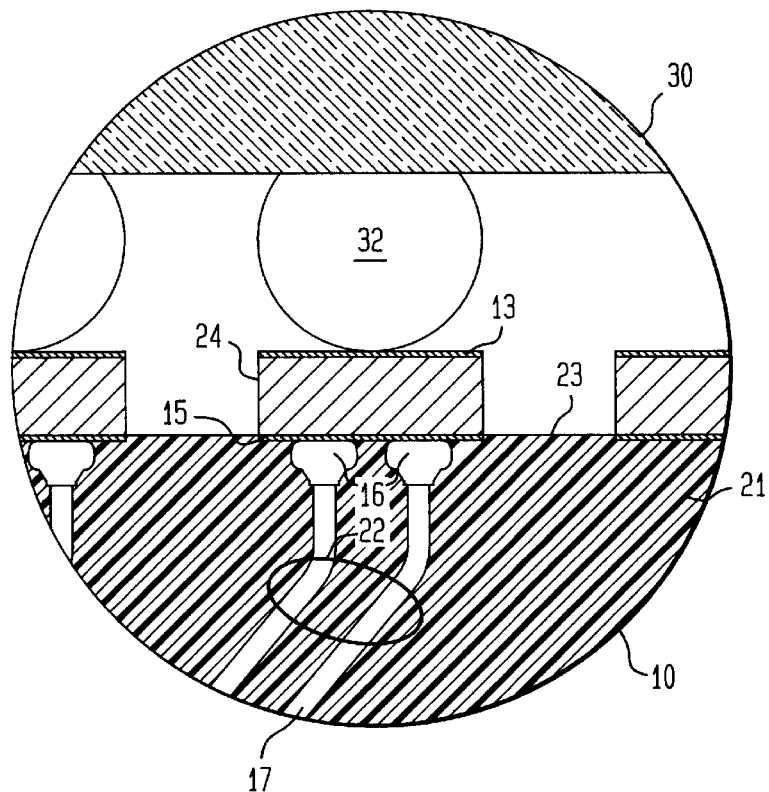
FIG. 3 shows a magnified view of a solder ball contact in relationship to a conductive pad contact attached to a two wire grouping.

A means to strengthen the interconnector medium is to group two or more embedded wires for connection to a common contact pad 24. A two wire grouping 22 is shown in FIG. 3. The grouping 22 provides enhanced ability to the embedded wires to withstand the pressure resulting from a compressed connection of the solder ball 32 to the contact pad 24. It results in an increased strength and compliant connective medium. Combining three or more wires in a grouping for attachment to a common contact pad further strengthens the connecting medium. In a three wire grouping the wires are best attached to the pad to form a triangle. In a four wire grouping the wires are preferably attached to the pads to form a square.

Figure 4:
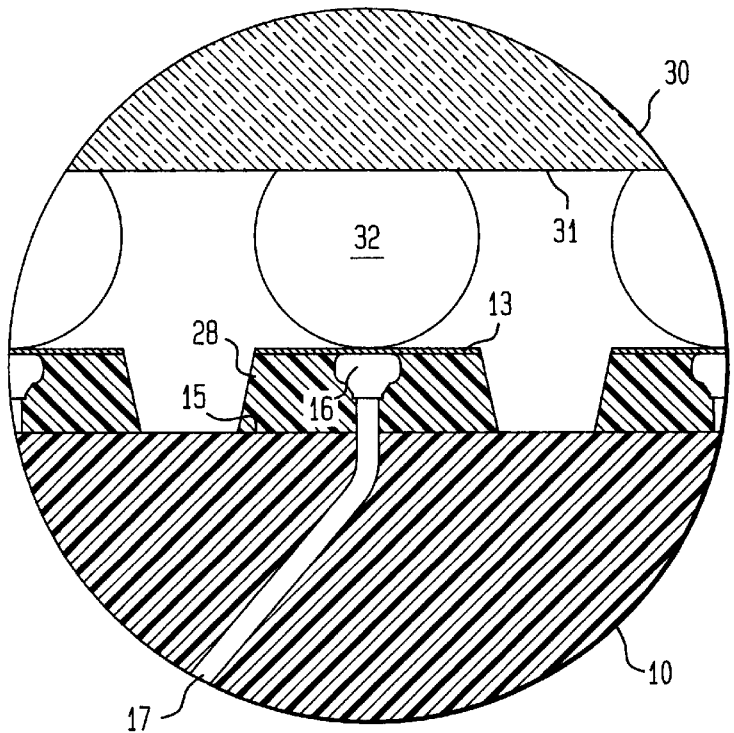
FIG. 4 shows a magnified view of a solder ball contact in relationship to a polymer contact attached to a single embedded wire.

A third alternative capable of providing connection of an SBC module to a circuit board and having enhanced durability is shown in FIG. 4. In this embodiment the conducting contact pad is replaced with a polymer pad 28. Use of a polymer pad enhances the overall compliance of the contact. The polymer pad 28 is coated with a metal 13. The metal coating 13 is attached to make electrical contact with an embedded wire 17. The metal coating 13 is generally plated with a noble metal.

Figure 5:
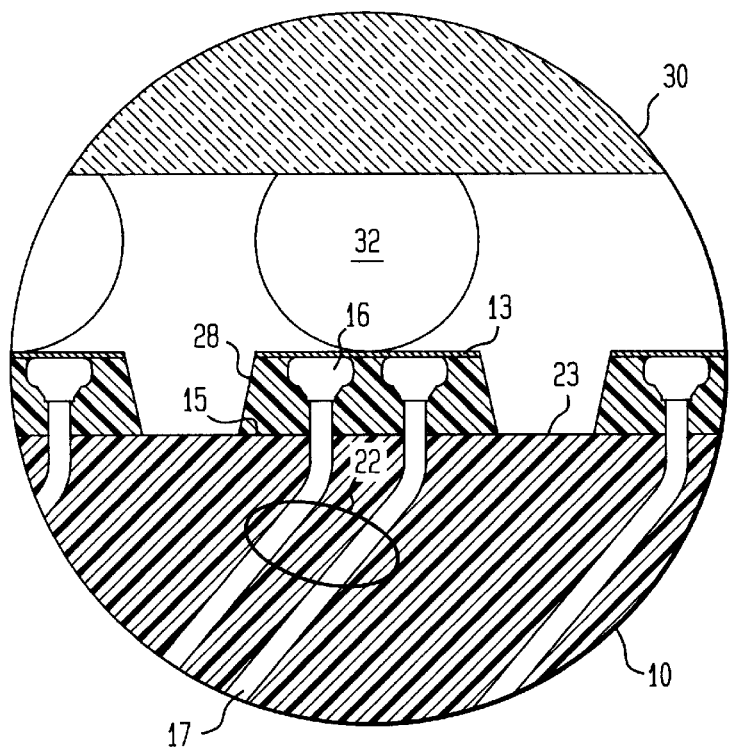
FIG. 5 shows a magnified view of a solder ball contact in relationship to a polymer contact attached to a two wire grouping.

A fourth embodiment combines the attributes of the second and third embodiments by having the polymer pad 28 enclose two or more wire bonding contacts 16 to form a wire group 22 as shown in FIG. 5. The enclosed wire bonding contacts 16 are all attached to make electrical contact with the common metal coating 13. This provides both a wide top end contact area for the solder ball contact 32 and also increases the strength, compliance and durability of the connecting medium which is a wire group 22 rather than an individual wire 17.

Figure 6:
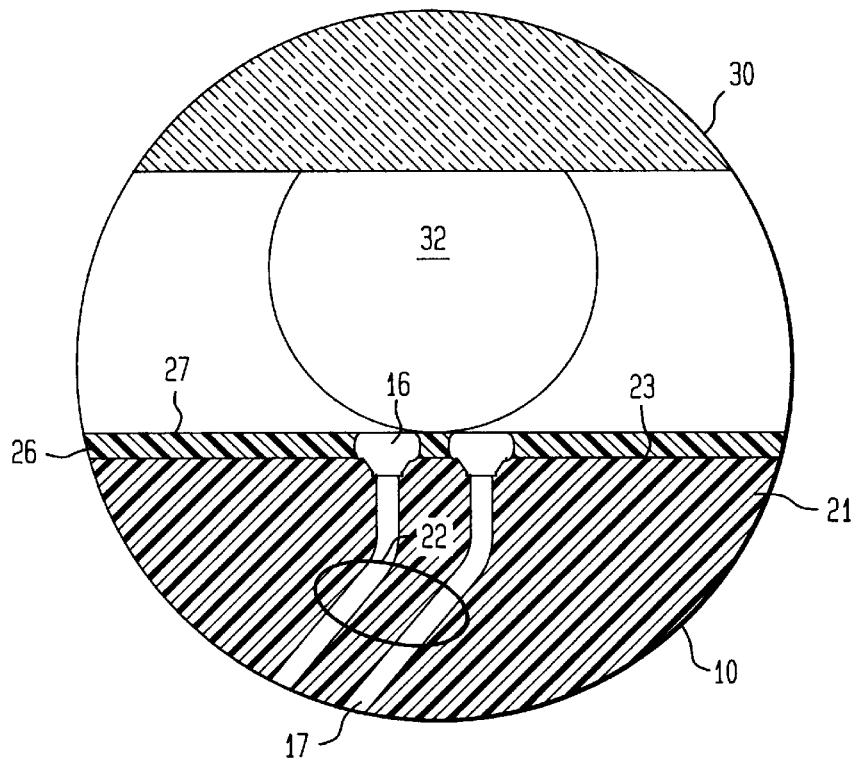
FIG. 6 shows a magnified view of a solder ball contact in relationship to wire bonding contact leading from a two wire grouping which is surrounded by a thin layer of flexible polymer.

FIG. 6 shows a magnified view of another alternative means for an interconnector with enhanced durability. It uses a thin layer of flexible polymer 26 placed upon the top surface 23 of the interconnector 10. The polymer is made to surround and essentially captivate the wire bonding contacts. Increased strength results when the polymer surrounds and captivates together two or more wire bonding contacts. FIG. 6 shows a two wire grouping. The wire bonding contact 16 on the end of the conductor wire 17 should have its top surface exposed and is best placed to be flush with the polymer surface 27 of the layer of polymer 26. The exposed wire bonding contact should be able to make direct electrical contact with the solder ball 32 on the SBC module 30. The thin layer of polymer distributes the contact force from the solder balls 32 on the SBC module over a wider area of the polymer surface 26 thereby preventing excessive deformation of the wire grouping 22 in the dielectric material 21. The dielectric material 21 is generally an elastomeric material.

In the present invention either or both ends of an embedded wire may have an enlarged end. An enlarged end may be attached to a single embedded wire or to a grouping means for grouping together a combination of at least two embedded members at the enlarged end. This is applicable when the grouping means is comprised of a conductive pad, or when the grouping means is comprised of a polymer pad which has a metallic coating which makes electrical contact with the enlarged end, especially when the coating is a metal selected from the group consisting of Au, Pd, Pt, or one of their alloys, or when an enlarged end extends to or through the body surface at a surface location wherein the grouping means is comprised of a polymer layer disposed over a body surface, and wherein the polymer layer has a hole corresponding to the surface location.

The enhanced durability connection methods described are best employed when the interconnector includes a fixture which can provide controlled connectivity of the SBC module to the connecting article. Therefore another object of the present invention is to provide a means to the connecting device to act as a clamping fixture so as to provide consistent pressure between the contacts of a module being interconnected, the interconnecting device and a connecting article. Preferably, the fixture should include a means of aligning the corresponding contacts on the interconnecting device with the module contacts and also with the connecting article.

Figure 7:
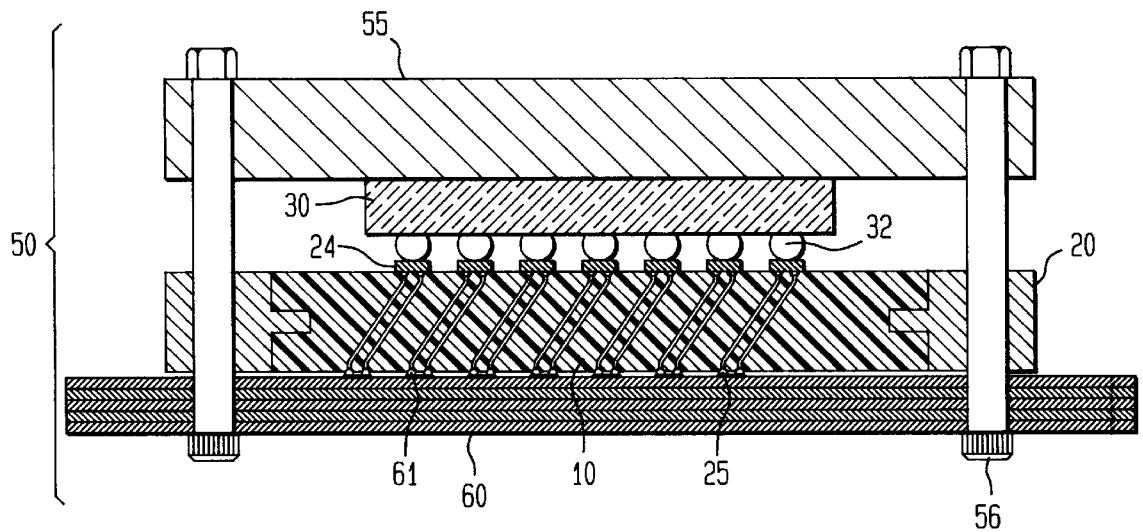
FIG. 7 shows an interconnector fixture using the interconnector of this invention.

FIG. 7 shows an embodiment of such a fixture 40. The interconnector 10 is held by a dam 20 in a position such that its lower laser ball contacts 25 are aligned with printed circuit board pads 61 on the connecting article 60. The SBC module 30 is positioned such that its solder balls 32 are aligned with the contact pads 24. A top plate 55 is placed over the SBC module 30. The entire assembly is held in place with fasteners 56 such as the nut and bolt shown in FIG. 6.

Figure 8:
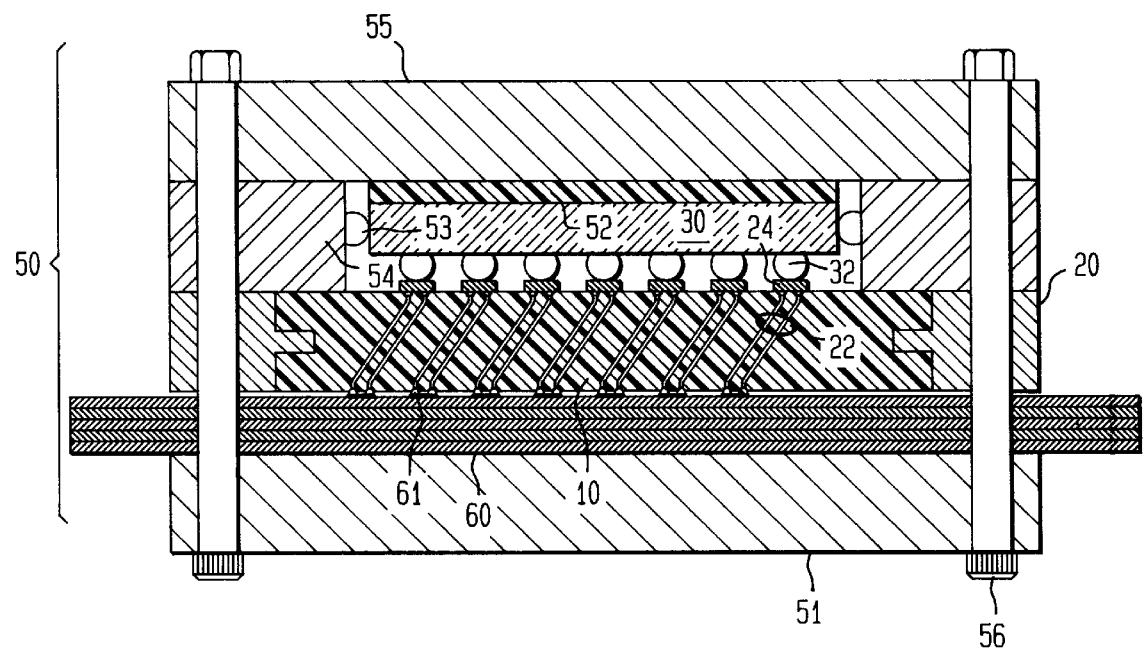
FIG. 8 shows another interconnector fixture using the interconnector of this invention.

FIG. 8 shows improvements that can be made to the fixture 50. These include the use of a cushion 52 between the SBC module 30 and the top plate 55. The cushion is a polymer cushion 52 which is used to transfer the clamping force from the top plate 55 of the clamping fixture 50 to the top surface of the SBC module 30. Use of a controlled thickness spacer 54 prevents over-compression of the solder ball contacts 32 with the connecting pads 24. The spacer 54 should also have an alignment feature 53 for fine alignment of the SBC module 30. The fixture 40 should also have a stiffener 51 placed between the fastener 56 and the connecting article 60. Use of a stiffener 51 prevents bowing of the connecting article 60.

Figure 9:
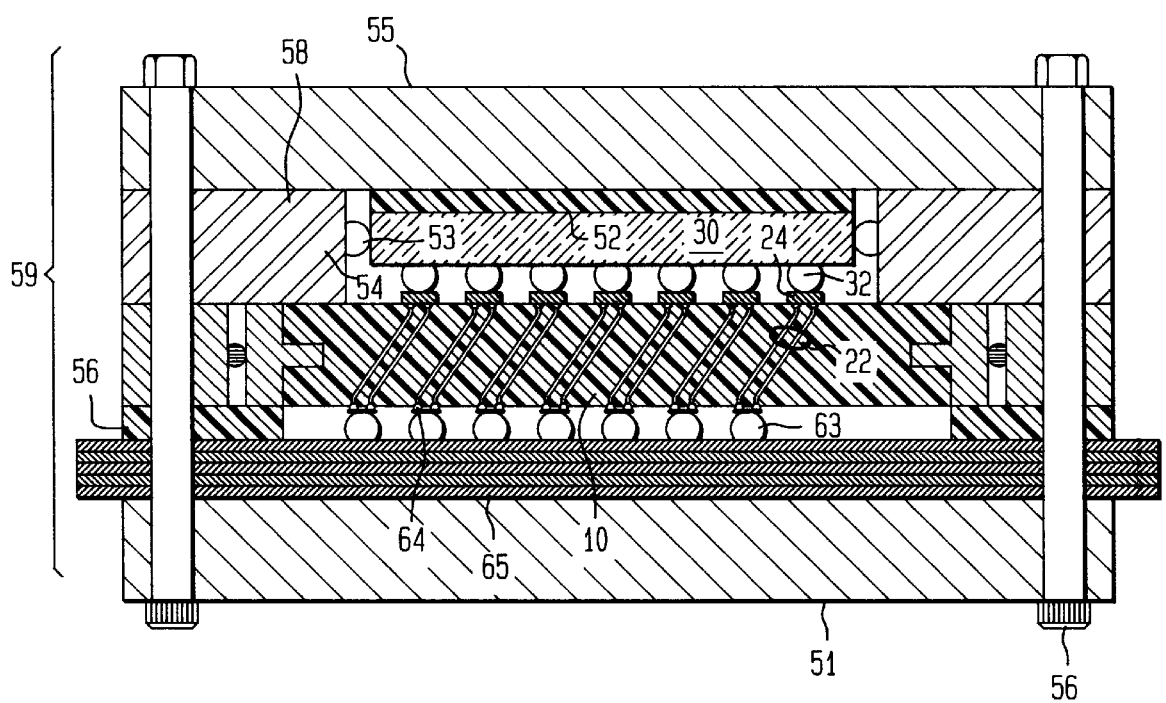
FIG. 9 shows an interconnector fixture for a connecting article having SBC type contacts.

The same methods employed for enabling reliable connection to the SBC module are useable for connection to the connecting article when desired or necessary. FIG. 9 shows a modified interconnector 9 useable to connect with an article 65 having SBC type contacts 63 or other similar contacts. In this situation, a second alignment feature 57 could be used for aligning the interconnector article pads 64 with the connecting article solder balls 63. A second spacer 56 could be used between the connecting article 65 and the enlarged first spacer 58. The second spacer 56 could be made of an elastic polymer.

In a similar fashion, the alternate techniques described and shown in FIGS. 2–6 can be used for either or both contact sides of the interconnector 9. The large pads 63 could be either of polymer or of a metallic material. A desirable process to fabricate large polymer pads 63 on the interconnector's article connecting surface is the following. A metallic sheet prestamped with a pattern having holes centered around, matching and larger than the article surface laser board arrangement is formed and attached to the interconnector surface. The patterned hole openings are filled partially or wholly with a polymer material. To form polymer pads, the structure is cured and the mask is removed either physically or by etching. To form metallic pads, the patterned holes are not filled wholly so as to leave room to spot or evaporate a desirable contact metallurgy over the laser ball and polymer surface before the mask is removed.

Figure 10:
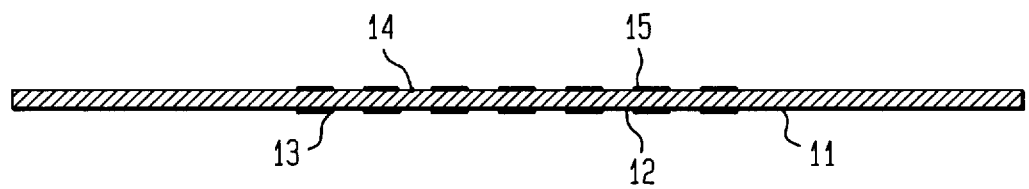
FIG. 10 shows the application of gold plating to an area array on the substrate.

FIG. 10 shows the first step used to fabricate an interconnector assembly, such as the interconnector assembly 35 shown in FIG. 8, with conductive contact pads 24 for the fixture 40. A substrate 11, made of copper or other suitable conductive material, is fabricated with an area array of gold plated bottom surfaces 13 on the substrate bottom surface 12, and a correspondingly positioned area array of gold plated top surfaces 15 on the substrate top surface 14. Other noble metal such as Pt or Pd can be used for the substrate area array plating instead of gold. A barrier layer is typically used under the noble metal to prevent diffusion of the substrate to the surface.

Figure 11:
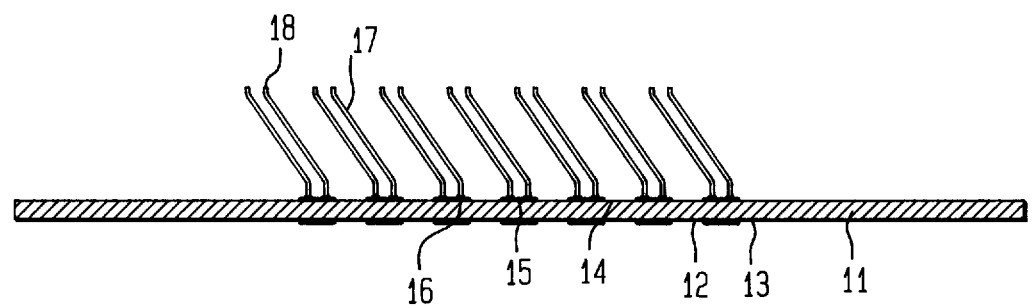
FIG. 11 shows the bonding of wires to the gold plated areas.

FIG. 11 shows the next step of bonding the wire bonding contacts 16 of two bond wires 17. The bond wire 17 is formed at an angle and cut to form a free standing structure with a straight end 18. Although FIG. 11 shows two bonding wires 17 bonded to the gold plated top surface, the same process would be followed when bonding laser balls emanating from one, three or more bond wires to each gold plated top surface.

Figure 12:
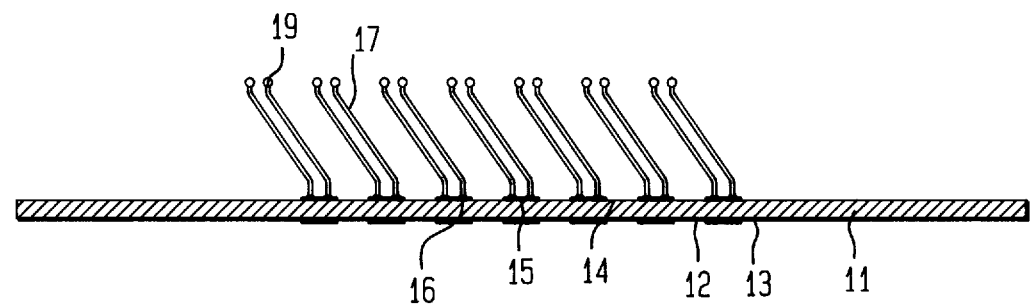
FIG. 12 shows the formation of laser balls on the bonded wires.

FIG. 12 shows the laser ball forming process at ends 18 of the angled bond wires 17 to create ball shaped contacts 19. The size of a ball shaped contact 19 on the end of the angled bond wires 17 is controlled by the laser power density and the alignment of the focal point from the end 18 of the wire. The resulting array of angled bond wires 17 forms the first substrate sub-assembly 8 upon which a casting dam 20 is placed.

Figure 13:
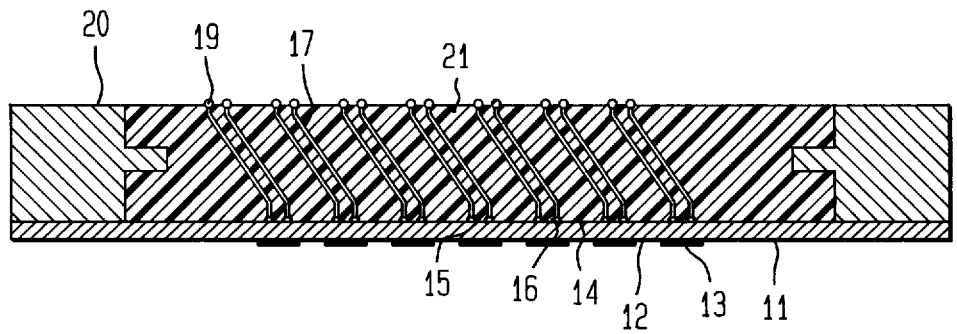
FIG. 13 shows the wires enclosed in a casting dam.
Figure 14:
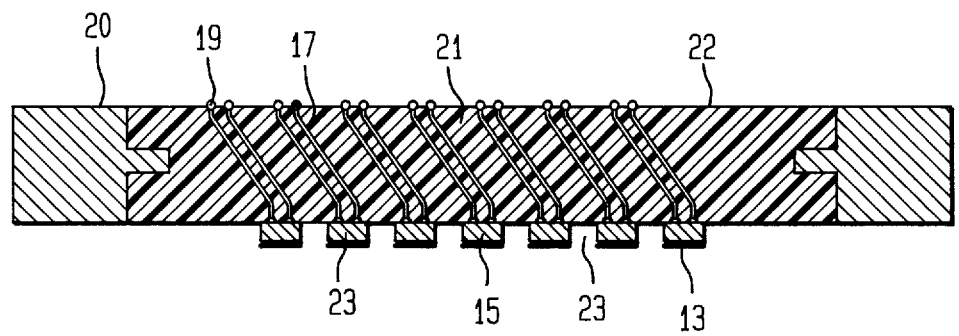
FIG. 14 shows the etching of the exposed substrate surface.
Figure 15:
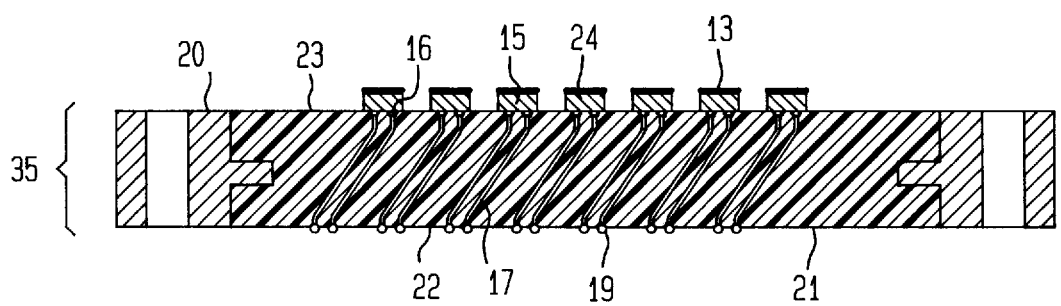
FIG. 15 shows the first interconnector assembly.

A casting dam 20 is placed around the array of angled bond wires as shown in FIG. 13. The casting dam 20 is used to contain an uncured dielectric material 21 until it is cured. The dielectric is usually a liquid elastomer. A controlled volume of dielectric material 21 is dispensed into the cavity formed by the casting dam 20 such as to leave the ball shaped contacts 19 exposed. The dielectric material is allowed to settle out before curing. Once the dielectric has cured, the substrate 11 is chemically etched as shown in FIG. 14. The etching process selectively removes the exposed unplated substrate on the substrate bottom surface 12 thereby leaving an array of individual conductive contact pads 24. The resulting first interconnector assembly 35 is inverted as shown in FIG. 15. The interconnector assembly 35 becomes an integral part of fixture 40, as shown in FIG. 7.

Any of the alternative methods described for forming high durability contacts on an interconnector 10 to connect to a module having solder ball contacts 32 can be used in producing a different interconnector assembly. Thus, FIG. 16 shows a second interconnector assembly 36 resulting when using polymer pads of the type illustrated in FIG. 5.

Figure 17:
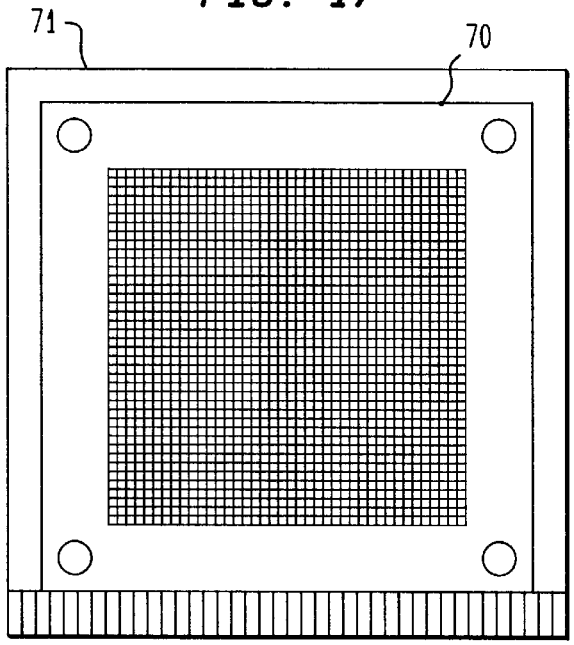
FIG. 17 shows a typical stamped substrate on the bonded wires.
Figure 18:
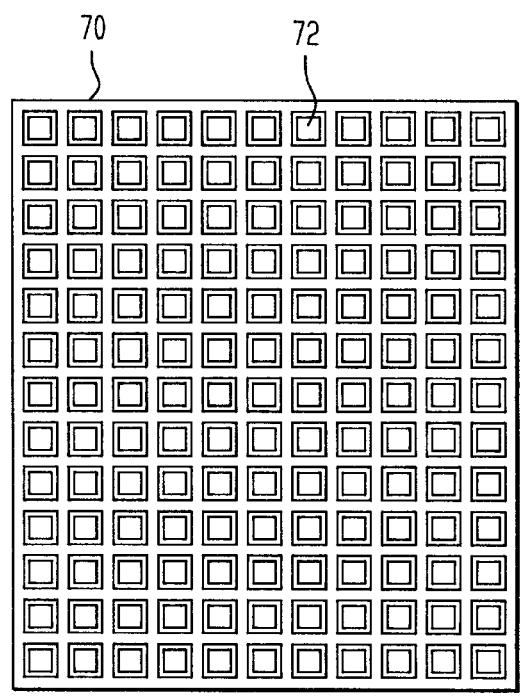
FIG. 18 shows an expanded view of a stamped substrate.

A process to form the polymer pads includes the following steps. A conductive substrate, usually a copper substrate, is prestamped with the desired shape and dimensions. FIG. 17 shows such a typical substrate 70 in relation to a substrate carrier 71. The stamping is such as to form a crater 72 in the substrate 70 at each point where it is desired to locate a polymer pad. An expanded view of the stamped substrate for a 13 by 11 pad array is shown in FIG. 18. The substrate 70 is thus capable of having up to 143 pads.

Figure 19:
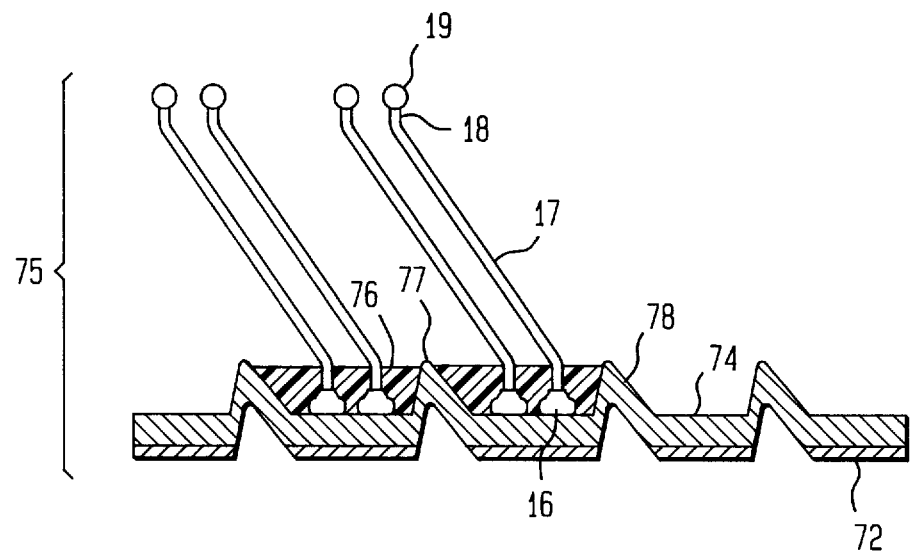
FIG. 19 shows a magnified side view of the second substrate sub-assembly.

FIG. 19 shows a magnified portion of a side view of the stamped substrate 70 with craters 72. The craters 72 generally have fixed pitch and height. Wires 17, having thermionic wire bonds 16 at one end, are put down at the bottom 74 of a crater 72 as shown in FIG. 19. The wires are formed at an angle and cut to form a free standing structure with a straight end 18. A laser ball 19 is formed at the straight end 18 of each wire. A polymer 76 is poured into each crater 72 so as to cover the wire bond 16, but not to reach the top of the crater 77. The polymer may be epoxy, polyimide or others known to those skilled in the art. The polymer is fully cured thereby forming a hard and large polymer pad. The resulting array of angled bond wires 17 forms the second substrate sub-assembly 75 upon which a casting dam 20 is placed.

Figure 16:
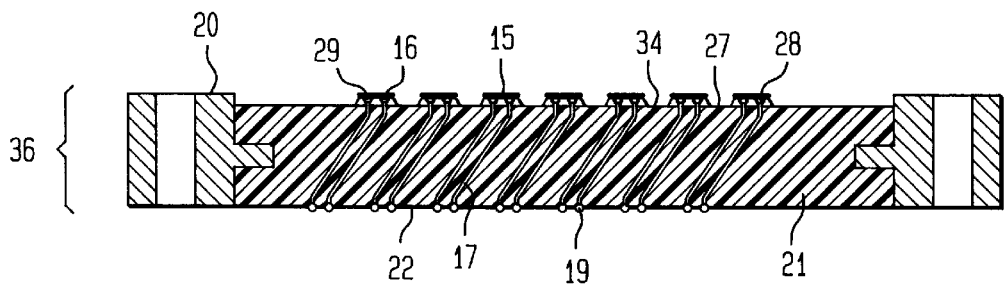
FIG. 16 shows the second interconnector assembly.

The second interconnector 36, shown in FIG. 16, can be formed by placing a casting dam 20 around the array of angled bond wires 17 of second substrate sub-assembly 75 in a similar fashion as was described for the embodiment shown in FIG. 13. The casting dam 20, shown inverted in FIG. 16, is used to contain an uncured dielectric material 21, usually an elastomeric solution, until it is cured. A controlled volume of dielectric material 21 is dispensed into the cavity formed by the casting dam 20 such as to leave the ball shaped contacts 19 exposed. The dielectric material is allowed to settle out before curing. Once the dielectric has cured, the substrate 70 is chemically etched. The etching process is such as to selectively remove the substrate crater walls 78 so as to leave an array of individual metallic covered polymer pads 28. The metallic cover 29 is generally plated with a noble metal. The plating serves as the contact interface with the solder ball 32 on an SBC module. The spaces 34 between contact pads 28 provides a means of mechanical decoupling from the adjacent contact pads and allows the contact pads 28 to compress independently for high compliance applications. The resulting second interconnector assembly 36 is inverted to the configuration shown in FIG. 16. The second interconnector assembly 36 can become an integral part of fixture 40 replacing first interconnector 35 in FIG. 7, and an integral part of fixture 45 replacing first interconnector 35 in FIG. 8.

Figure 20:
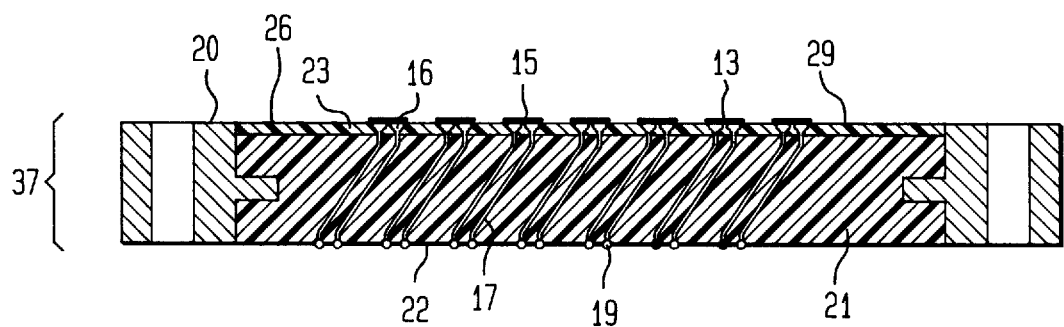
FIG. 20 shows the third interconnector assembly.
Figure 21:
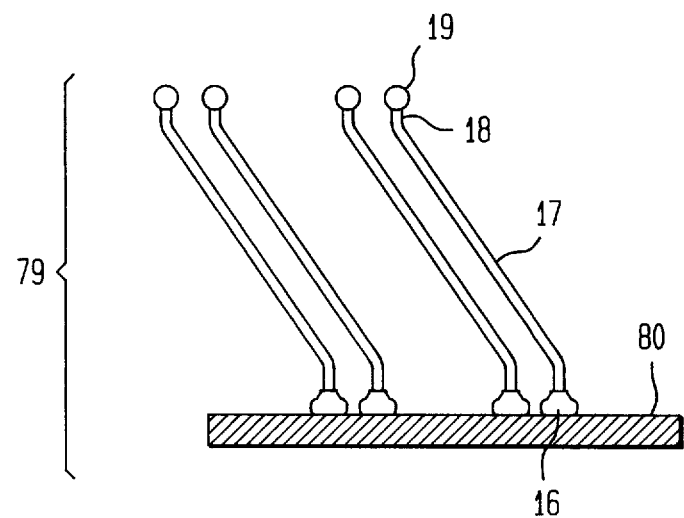
FIG. 21 shows a magnified side view of the third substrate sub-assembly.

FIG. 20 shows a third interconnector assembly 37 resulting when the technique shown in FIG. 6 is used. It uses plated wire bonding contacts 16 to connect directly with the solder ball connections. The wire bonding contacts 16 are captivated in a flexible polymer 26. It is best to have the balls bonds 16 on the ends of the conductive wires 17 flush with the polymer top surface 29 of the thin layer of polymer 26 so as to provide a direct contact interface with the solder ball contacts of the SBC module. The third interconnector assembly 37 can be formed by using a thin, essentially flat substrate 80 shown in FIG. 21. The substrate is marked correspondingly on both its flat surfaces to indicate the desired positions of the wire bonding contacts. Wires 17, having thermionic wire bonds 16 at one end, are put down according to the substrate marking. The wires are formed at an angle and cut to form a free standing structure with a straight end 18. A laser ball 19 is formed at the straight end 18 of each wire.

The resulting array of angled bond wires 17 forms the third substrate subassembly 79 upon which a casting dam 20 is placed.

The third interconnector 37 shown in FIG. 20, is formed by placing a casting dam 20 around the array of angled bond wires 17, contained in the third substrate sub-assembly 79, in a similar fashion as was described for the embodiment shown in FIG. 13. The casting dam 20, shown inverted in FIG. 20, is used to receive a polymer 26 poured upon the substrate so as to enclose the wire bonding contacts 16. The polymer may be epoxy, polyimide or others known to those skilled in the art The polymer is fully cured thereby forming a thin polymer layer captivating the wire bonding contacts. A controlled volume of dielectric material 21 is dispensed into the cavity on top of the polymer layer 26 such as to leave the ball shaped contacts 19 exposed. The dielectric material, usually an elastomeric solution, is allowed to settle out before curing. Once the dielectric has cured, the substrate 62 is chemically etched. The etching process is such as to remove the substrate so as to leave an array of exposed individual, or groupings of, wire bonding contacts 16. The wire bonding contacts 16 are generally plated with a noble metal. The plating serves as the contact interface with the solder ball 32 on an SBC module. Encasing the wire bonding contacts 16 in the thin layer of polymer 28 distributes the contact force from the solder balls 32 on the SBC module over a wider area on the top surface 27 of the interconnector socket 37 to prevent excessive deformation of the wire conductors 17 in the elastomer material 21. The resulting third interconnector assembly 37 is inverted to the configuration shown in FIG. 17. The third interconnector assembly 37 can become an integral part of fixture 40 replacing first interconnector 35 in FIG. 7, and an integral part of fixture 45 replacing first interconnector 35 in FIG. 8.

While several embodiments of the invention have been described, it is understood to those skilled in the art, that many variations are available using the inventive structure and processes disclosed in this invention. It is also understood that although the inventive structures and processes were described variously using SBC contacts, wire bonding contacts, laser ball contacts and particular materials any other suitable contact technology or material may be used to achieve the intent and purpose of the present invention.

What is claimed:

1. A structure comprising:
    a dielectric body of an elastomeric material having a first surface and a second surface;
    at least two conductive members embedded in said body, each said member having two ends, one of said ends being a first end having an enlarged, substantially flat, wide surface area extending at least to said first surface, and a second one of said ends, extending at least to said second surface;
    a component having at least one solder ball contact, said solder ball contact making connection with said first end of at least one of the two conductive members;
    a connecting article having at least one article contact, said article contact making connection with said second end; and
    a ball compression means for compressing said solder ball connection to said first end.

2. A structure as in claim 1, including a grouping means for grouping together said at least two said conductive members at their enlarged ends.

3. A structure of claim 2, in which said grouping means is comprised of a conductive pad.

4. A structure as in claim 3, in which said grouping means is comprised of a polymer pad, said pad having a metallic coating on the surface thereof, the coating for making electrical contact to said first end of the grouped conductive members and the solder ball contact.

5. A structure as in claim 4, further comprising a contact compression means for compressing said article contact to the second ends of the two conductive members.

6. A structure as in claim 5, in which said ball compression means further comprises at least one spacer disposed so as to prevent over compression.

7. A structure as in claim 6, in which said ball compression means further comprises at least one alignment means.

8. A structure as in claim 7, in which said ball compression means further comprises a collar disposed around said dielectric body.

9. A structure comprising:
    a dielectric body of an elastomeric material having a first surface and a second surface;
    a group of at least two conductive members embedded in said body, each said member having two ends, one of said ends being a first end at said first surface, and a second one of said ends extending at least to said second surface;
    an enlarged substantially flat conductive pad at said first surface for making electrical connection therethrough to said group;
    a component having at least one solder ball component contact, said component contact for making electrical connection with said conductive pad;
    a connecting article having at least one article contact, said article contact making connection with said group at second end of said members; and
    a compression means for compressing said component contact to said conductive pad.

10. The structure as in claim 9, including a contact compression means for compressing said article contact to said second end.

11. A structure of claim 10, in which said compression means further comprises at least one spacer disposed so as to prevent over compression.

12. A structure of claim 11, in which said compression means includes at least one alignment means; and
    said dielectric body includes a collar disposed around said elastomeric material.

13. A structure comprising:
    a dielectric body of an elastomeric material having a first surface and a second surface;
    a conductive member embedded in said body, said member having two ends, one of said ends being a first end having an enlarged, substantially flat, wide surface area extending at least to said first surface, and a second one of said ends extending at least to said second surface;

a component having at least one solder ball contact, said solder ball contact making connection with said first end of at least one of the two conductive members;

a connecting article having at least one article contact, said article contact making connection with said second end; and a ball compression mean, for compressing said solder ball connection to said first end.

14. A structure as in claim 13, further comprising a contact compression means for compressing said article contact to the second end of the conductive member.

15. A structure as in claim 14, in which said ball compression means further comprises at least one spacer disposed so as to prevent over compression.

16. A structure as in claim 15, in which said ball compression means further comprises at least one alignment means.

17. A structure as in claim 16, in which said ball compression means further comprises a collar disposed around said dielectric body.

18. A structure as in claim 17, in which said at least one end being enlarged is coated with a metal selected from the group consisting of Au, Pd, Pt, Au alloy, Pd alloy and Pt alloy.

* * * * *